United States Patent [19]

Oishi et al.

[11] Patent Number: 4,680,737

[45] Date of Patent: Jul. 14, 1987

[54] SEMICONDUCTOR INTEGRATED CIRCUIT DEVICE

[75] Inventors: Kanji Oishi, Koganei; Takashi Shinoda, Kodaira, both of Japan

[73] Assignee: Hitachi, Ltd., Tokyo, Japan

[21] Appl. No.: 727,922

[22] Filed: Apr. 29, 1985

[30] Foreign Application Priority Data

May 7, 1984 [JP] Japan ................................. 59-89420

[51] Int. Cl.⁴ .............................................. G11C 7/00
[52] U.S. Cl. ...................................... 365/222; 365/189
[58] Field of Search ................ 365/189, 222, 230, 233

[56] References Cited

U.S. PATENT DOCUMENTS 4,376,988  3/1983  Ludwig et al. ..................... 365/222

FOREIGN PATENT DOCUMENTS 59-40394  3/1984  Japan .................................. 365/222

OTHER PUBLICATIONS

M. Taniguchi et al., "M5K 4164S A Refresh Function Incorporated Therein", Denshi Gijutsu, vol. 23, No. 3, pp. 30-33 (publication date not available).

Primary Examiner—Joseph A. Popek
Attorney, Agent, or Firm—Antonelli, Terry & Wands

[57]  ABSTRACT

A semiconductor integrated circuit device which constitutes a dynamic RAM has an automatic refresh circuit that contains a refresh timer circuit. The refresh timer circuit has a program element such as a fuse element. The program element is programmed depending upon the data holding characteristics of the dynamic memory cells. Therefore, the refresh period is changed depending upon the characteristics of the dynamic memory cells. According to this construction, the refresh period changes and, as a result, any undesired refresh operation is prevented from being executed, making it possible to reduce the amount of electric power consumed by the circuit device.

13 Claims, 4 Drawing Figures

SEMICONDUCTOR INTEGRATED CIRCUIT DEVICE

BACKGROUND OF THE INVENTION

The present invention relates to a semiconductor integrated circuit device, and particularly to a technique that can be effectively utilized for a dynamic RAM (random access memory) which contains an automatic refresh circuit.

Memory cells in a dynamic RAM are each constituted by a storage capacitor for storing the data in the form of an electric charge, and a MOSFET for selecting the address. In a memory cell formed on a semiconductor substrate, the electric charge stored in the capacitor decreases with the lapse of time due to leakage currents that flow through a pn junction between the capacitor and the semiconductor substrate and a pn junction of the MOSFET. In order to store correct data in a memory cell at all times despite leakage of the electric charge stored in the capacitor, it is necessary to carry out a refresh operation in which the data stored in the memory cell is read out before it is lost, amplified, and written again to the same memory cell.

A known system for automatically refreshing the memory cells in a 64-kilobit dynamic RAM can be represented by an automatic refresh circuit which is disclosed, for example, in the journal "Denshi Gijutsu", Vol. 23, No. 3, pp. 30-33. That is, the dynamic RAM has an automatic refresh function for automatically refreshing a plurality of memory cells in the dynamic RAM when a refresh control signal $\overline{REF}$ of a predetermined level is applied to an external terminal thereof, and a self-refresh function according to which, when the refresh signal $\overline{REF}$ is maintained at a predetermined level for a predetermined period of time, a timer circuit contained therein works so that the refresh operation is performed after every predetermined period of time.

In the conventional refresh timer, a predetermined cycling time has been employed such as 4 ms/ 256 cycles. In a dynamic RAM having good refresh characteristics, however, the data can be kept stored even when a longer cycling time is employed. The inventors therefore have contrived to select the time of the refresh timer depending upon the characteristics of elements.

SUMMARY OF THE INVENTION

The object of the present invention is to provide a semiconductor integrated circuit device which contains a simply constructed timer circuit that is capable of variably setting the time.

The above and other objects as well as novel features of the present invention will become obvious from the description of the specification and the accompanying drawings.

A representative example of the invention disclosed in this application will be briefly described below. That is, a plurality of MOSFET's are connected in series to permit the flow of discharge current from the capacitor. Further, discharge MOSFET's that can be selectively operated by program elements are provided between the connection points of the plurality of MOSFET's and a point of ground potential of the circuit, so that the time can be varied.

DESCRIPTION OF THE PREFERRED EMBODIMENTS

Figure 1:
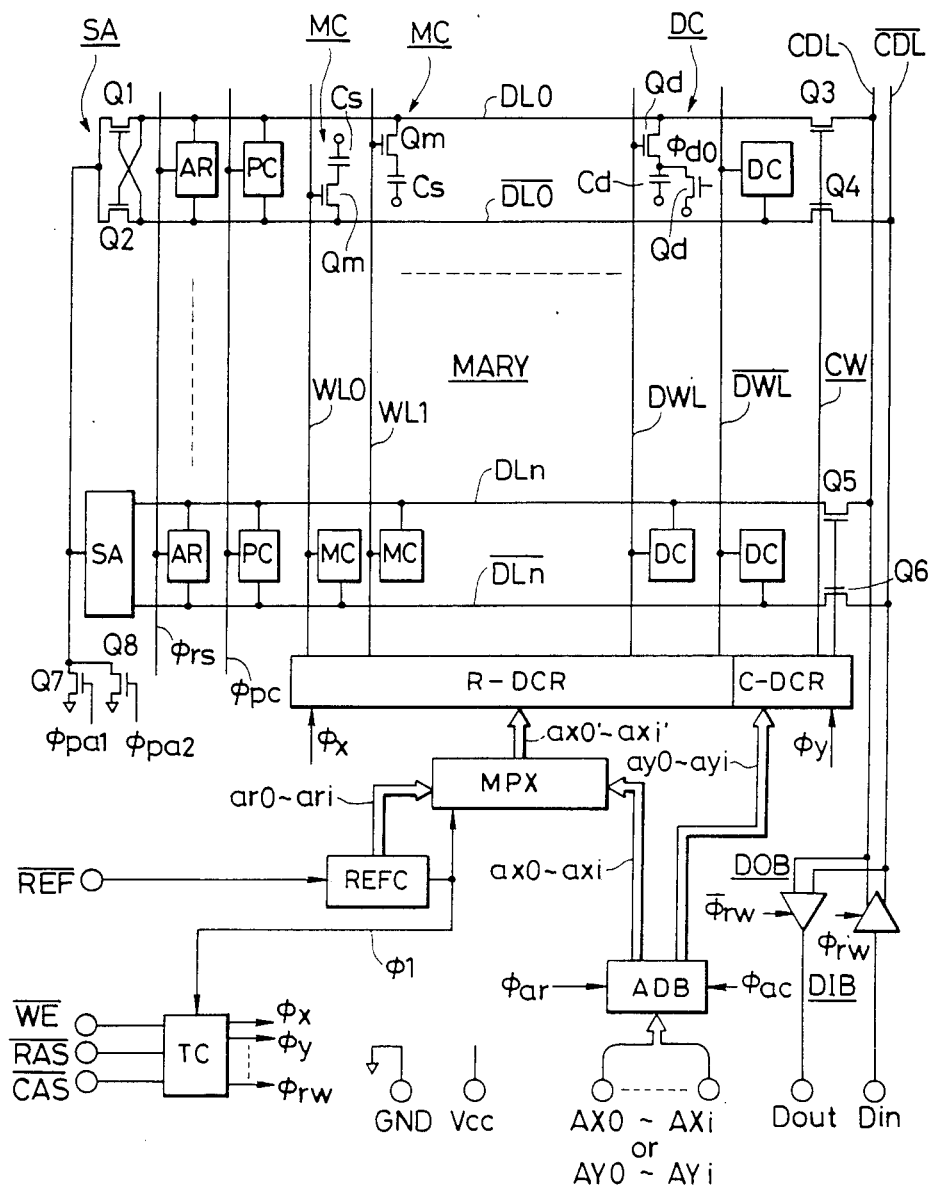
FIG. 1 is a block diagram of a dynamic RAM according to an embodiment of the present invention.

FIG. 1 shows a circuit of an embodiment in which the present invention is applied to a dynamic RAM.

In the circuit of the embodiment of FIG. 1, the circuit elements are constituted by IGFET's (insulated gate field-effect transistors) as represented by n-channel MOSFET's.

A memory array or a memory matrix MARY is constructed with a plurality of dynamic memory cells MC arranged in the form of a matrix, a plurality of bit lines or data lines $DL_O$, $\overline{DL_O}$ to $DL_n$, $\overline{DL_n}$, and a plurality of word lines WLO to WLl.

Though there is no particular limitation, the memory array MARY of this embodiment is constituted relying upon a folded bit line construction. That is, among the plurality of data lines, the neighboring data lines, i.e., DLO and $\overline{DLO}$, ... $DL_n$, $\overline{DL_n}$ constitute pairs (such pairs of data lines are hereinafter referred to as complementary data lines).

A memory cell MC of one bit consists, as shown in FIG. 1, of a capacitor Cs for storing the data and a MOSFET Qm for selecting the address. A logic "1" or logic "0" is stored in capacitor Cs depending on whether said capacitor Cs is charged or not.

Each memory cell MC is connected between a word line and either one of the complementary data lines. The gate of MOSFET Qm in the memory cell MC is regarded as a select terminal of the memory cell MC and is connected to a corresponding word line. A current carrying electrode of the MOSFET Qm is regarded as an input/output terminal of the memory cell and is connected to a corresponding data line.

Each data line has a parasitic capacity consisting of a stray capacity of the data line itself and a parasitic capacity formed by the input/output terminal of each memory cell MC. The memory cells are connected in an equal number to the data lines so that the individual data lines will have an equal capacity.

To read out the data, the MOSFET Qm is rendered conductive, the capacitor Cs is connected to a common data line DL, and the change of the potential of the data line DL which varies with the electric charge stored in the capacitor Cs is sensed.

To form the memory array MARY having a high degree of integration and a large capacity, the memory cells MC are formed so as to be small and a great number of these are connected to the data line DL. Therefore, the relation between the capacitor Cs and stray capacity Co (not shown) of the data line DL is very small, i.e., the ratio Cs/Co is very small. Depending upon the electric charge stored in the capacitor Cs, therefore, a very small potential change, i.e., a very small data signal, is applied to either the data line DL or $\overline{DL}$.

To detect such a very small signal, a reference potential is formed by a dummy cell DC that is provided for each of the data lines. The dummy cell DC is produced under the same manufacturing conditions as the memory cell MC and has the same design constants, with the exception that the capacitor Cd has a capacity nearly one-half the capacity of the capacitor Cs of the memory cell MC. The capacitor Cd is reset by a MOSFET Qd' prior to addressing.

As described above, the capacitor Cd has a capacity nearly one-half the capacity of the capacitor Cs, and forms a reference voltage which is nearly one-half the voltage of the read signal from the memory cell MC.

In FIG. 1, the sense amplifiers SA are connected at their input/output nodes to pairs of complementary data lines DL, $\overline{DL}$ that are arranged in parallel, and expand the difference of potential change that develops at addressing on the data lines DL, $\overline{DL}$ to a sense period that is determined by timing signals (sense amplifier control signals) $\phi_{pa1}$, $\phi_{pa2}$. The operation thereof will be described later. An equal number of memory cells are coupled to each of the complementary data lines DL, $\overline{DL}$ in order to increase the precision of detection as mentioned earlier. In the memory array MARY of the folded bit line construction, the word lines WL are arranged to cross the complementary data lines. When the level changes in one of the plurality of word lines WL, a potential is applied to the data lines via undesired coupling capacities between the word line and the data lines, thereby generating noise. In the memory array of the folded bit line construction, noise components of substantially the same level are applied to the complementary data lines responsive to the change in the level of the word line. That is, the noise applied to the complementary data lines is regarded as common mode noise. The differential sense amplifier SA is not sensitive to common mode noise, and responds substantially to data signals only.

When a memory cell MC connected to either one of the complementary data lines DL, $\overline{DL}$ is selected at addressing, either one of a pair of dummy word lines DWL, $\overline{DWL}$ is selected such that a dummy cell DC is necessarily coupled to the other data lines.

Though not limited to this configuration, the sense amplifier SA consists of a pair of MOSFET's Q1 and Q2 that are cross-connected as shown in FIG. 1, and differentially amplifies small signals that appear on the complementary data lines DL, $\overline{DL}$ relying upon the positive feedback function thereof. The positive feedback function is carried out in two steps though it is not specifically limited to this method. The operation of the first step is started as the MOSFET Q7 having a relatively small conductance is rendered conductive by a relatively early timing signal $\phi_{pa1}$. Here, a potential difference has been given to the complementary data lines DL, $\overline{DL}$ by addressing. As the operation of the first step is started, therefore, the higher potential of the data line falls off slowly, and the lower potential of the data line falls off rapidly. The difference between the rates at which the two potentials fall off increases with the passage of time. The operation of the second step is initiated when the MOSFET Q8 having relatively high conductance is rendered conductive by a timing signal $\phi_{pa2}$ at a moment when the potential difference has reached a predetermined value. As the operation of the second step is started, the lower potential of the data line drops quickly. By operating the sense amplifier SA in two steps, the higher potential can be prevented from falling off. When the lower potential is less than the threshold voltage of the cross-coupled MOSFET's, the positive feedback function is complete. Accordingly, the higher potential is retained at a value lower than the power-source voltage Vcc but higher the threshold voltage, and the lower potential finally reaches ground potential (zero volts).

At addressing, the stored data of memory cell MC that has been temporarily destroyed is recovered by the potential of the high level or the low level that is obtained by the sense operation. However, if the high level falls off by more than a predetermined value with respect to the power-source voltage Vcc, as described above, logic level "1" stored in the memory cell may be erroneously read as logic level "0" after the read and rewrite operations have been repeated many times. To prevent such an erroneous operation, provision is made for an active restore circuit AR which works to selectively boost the high-level signals only to the power-source voltage Vcc without affecting the low-level signals.

The data lines DL0, $\overline{DL0}$ shown in FIG. 1 are connected to a pair of common complementary data lines CDL, $\overline{CDL}$ via MOSFET's Q3, Q4 that constitute a column switch CW. Similarly, other data lines DLn, $\overline{DLn}$ are connected to the pair of common complementary data lines CDL, $\overline{CDL}$ via MOSFET's Q5, Q6. The pair of common complementary data lines CDL, $\overline{CDL}$ are connected to an input terminal of a data output buffer DOB which contains an output amplifier and to an output terminal of a data input buffer DIB.

The data output buffer DOB is controlled by a timing signal $\overline{\phi rw}$ produced by a timing control circuit TC, and amplifies a data signal between the pair of common complementary data lines CDL, $\overline{CDL}$, and sends the amplified data signal to the output terminal Dout.

The data input buffer DIB is controlled by a timing signal $\phi rw$ and sends a complementary data signal which corresponds to a write data signal at the input terminal Din to the pair of common complementary data lines CDL, $\overline{CDL}$. When not in operation, the data input buffer DIB has a large output impedance (assumes the condition of high output impedance state).

An operation of the address buffer ADB is controlled by the timing signals $\phi ar$ and $\phi ac$. When a timing signal $\phi ar$ is generated in response to a row address strobe signal $\overline{RAS}$, the row address buffer ADB introduces external address signals AX0 to AXi of the row system in synchronism therewith, and produces internal complementary address signals ax0 to axi of the row system. Further, when a timing signal $\phi ac$ is generated in response to a column address strobe signal $\overline{CAS}$, the address buffer ADB introduces external address signals AY0 to AYi of the column system in synchronism therewith, and produces internal complementary address signals ay0 to ayi of the column system.

Upon receipt of internal complementary address signals formed by the address buffer ADB, the row decoder R-DCR and column decoder C-DCR form a word line select signal, a dummy word line select signal and a column switch select signal, and effect addressing for a memory cell and a dummy cell. That is, when a timing signal $\phi ar$ is generated in response to the row address strobe signal $\overline{RAS}$, the external address signals AX0 to AXi are received by the address buffer ADB in synchronism therewith. The internal complementary address signals ax0 to axi formed by the address buffer ADB are transmitted to the row decoder R-DCR via a multiplexer MPX that will be described later. The row decoder R-DCR is controlled by a word line select timing signal $\phi x$ and selects a predetermined word line and a dummy word line responsive thereto. As the timing signal $\phi ac$ is generated in response to the column address strobe signal $\overline{CAS}$, the address buffer ADB receives the external address signals AY0 to AYi in synchronism therewith. The internal complementary address signals ay0 to ayi formed by the address buffer ADB are transmitted to the column decoder C-DCR which is controlled by a data line select timing signal $\phi y$ and which selects a data line in response thereto.

The multiplexer MPX is controlled by a timing signal $\phi 1$ produced by a refresh control circuit REFC and selects either one side of the internal complementary address signals ax0 to axi or the refresh address signals ar0 to ari of the refresh control circuit REFC depending upon the level of the timing signal $\phi 1$. That is, when the timing signal $\phi 1$ is at the refresh operation level, the multiplexer MPX selects refresh address signals ar0 to ari in response thereto.

Upon receipt of address strobe signals $\overline{RAS}$, $\overline{CAS}$ and a write enable signal WE supplied from external units, a timing control circuit TC forms various timing signals inclusive of the abovementioned timing signal.

The timing signals $\phi ar$, $\phi pc$, $\phi x$, $\phi_{pa1}$, $\phi_{pa2}$ and $\phi rs$ are regarded to be timing signals of the rwo system that respond to the rwo address strobe signals $\overline{RAS}$ (hereinafter referred to as $\overline{RAS}$ signals), and the timing signals $\phi ac$, $\phi y$, $\phi rw$ and $\overline{\phi rw}$ are regarded to be timing signals of the column system that respond to the column address strobe signals $\overline{CAS}$ (hereinafter referred to as $\overline{CAS}$ signals).

That is, the timing signal $\phi ar$ is generated as the $\overline{RAS}$ signal falls to the low level. In other words, the timing signal $\phi ar$ is generated as the access of the dynamic RAM is started.

When the $\overline{RAS}$ signal falls to the low level, the timing signal $\phi pc$ for controlling the precharge falls to the low level so that a precharge circuit $\phi pc$ is placed in the inoperative condition.

The word line select timing signal $\phi x$, is held at the low level and then changed to the high level when the timing signal $\phi ar$ is generated.

After the word line select timing signal $\phi x$ is changed to the high level, timing signal $\phi_{pa1}$ and $\phi_{pa2}$ are changed to the high level in order to place the sense amplifier SA under the operative condition.

After the timing signals $\phi_{pa1}$, $\phi_{pa2}$ at the high level are produced, the timing signal $\phi ar$ is changed to high level in order to place the active restore circuit AR under the operative condition.

The timing signals $\phi x$, $\phi_{pal}$, $\phi 2$, $\phi rs$ and so on are changed to the low level when the level of the $\overline{RAS}$ signal is changed to the high level again.

The timing signal $\phi ac$ is produced in response to the production of the $\overline{CAS}$ signal of the low level.

After the timing signal $\phi ac$ is produced, the timing signal $\phi y$ is changed to the high level in order to operate the column decoder C-DCR.

When the $\overline{WE}$ signal is held at the high level, the timing signal $\overline{\phi rw}$ is changed to the high level after the timing signal $\phi Y$ to operate the output buffer DOB.

When the $\overline{WE}$ signal is changed to the low level, the timing signal $\phi rw$ is changed to the high level in response thereto to place the data input buffer DIB under the operative condition.

According to this embodiment, the timing signal $\phi 1$ supplied from the refresh control circuit REFC to the timing control circuit TC is regarded to be a row address strobe signal depending upon the timing control circuit TC. As the timing signal $\phi 1$ is generated, timing signals $\phi x$, $\phi pc$, $\phi_{pal}$, $\phi_{pa2}$, $\phi rs$ of the row system are produced from the timing control circuit TC.

The refresh address signals ar0 to ari are supplied to the row decoder R-DCR when the timing signal $\phi 1$ is generated. When the timing signals of the row system are generated, therefore, the refresh operation is executed in response to the timing signal $\phi 1$.

Figure 2:
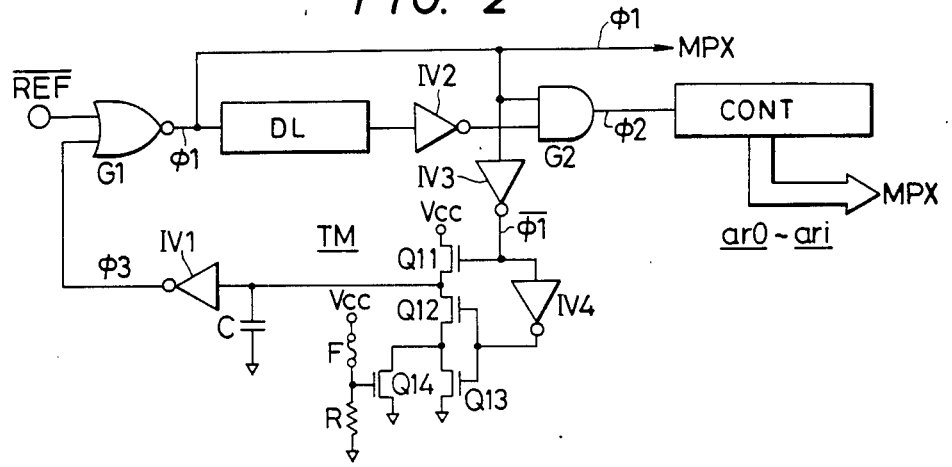
FIG. 2 is a diagram of a refresh control circuit according to the embodiment of the present invention.

Though it is not limited to this configuration, the refresh control circuit REFC includes a timer circuit and a counter circuit which forms internal row address signals ar0 to ari, as shown in FIG. 2, and is operated by a refresh signal $\overline{REF}$ supplied through an external terminal.

FIG. 2 is a diagram of the above-mentioned refresh control circuit REFC according to an embodiment.

Though it is not limited to this configuration, the timer circuit TM consists of inverter circuits IV1, IV3, IV4, a precharge MOSFET Q11, discharge MOSFET's Q12 to Q14, a pull-down resistor R, fuse means F, and a capacitor C.

In the construction of FIG. 2, it can be regarded that MOSFET's Q11 to Q13 and the inverter circuit IV4 constitute a circuit for driving the capacitor C. It can be regarded that the fuse means F and the resistor R constitute a program circuit. Furthermore, the MOSFET's Q14, Q13 can be regarded as variable impedance elements.

The inverter circuit IV3 forms a signal $\overline{\phi 1}$ when it is served, through its input terminal, with the signal $\phi 1$ produced by a NOR gate circuit that will be described later. The input signal $\overline{\phi 1}$ formed by the inverter circuit IV3 is supplied to the gate of precharge MOSFET Q11 which is provided between the power-source terminal $V_{CC}$ and the capacitor C and which executes the program of the capacitor C. In other words, the MOSFET Q11 works as an element that resets the timer circuit.

The output signal $\overline{\phi 1}$ of the inverter circuit IV3 is also supplied to the input terminal of the inverter circuit IV4 which forms an inverted signal of the signal $\overline{\phi 1}$. The output signal of the inverter circuit IV4 is commonly supplied to the gates of discharge MOSFET's Q12 and Q13 that are connected in series between the source of MOSFET Q11 and a point of ground potential. The discharge MOSFET Q14 is provided between a point of ground potential of the circuit and a point where the discharge MOSFET's Q12 and Q13 are commonly connected. The discharge MOSFET Q14 varies the period of the timer. Though it is not limited to this configuration, fuse means F is provided between the gate of MOSFET Q14 and the power-source terminal Vcc of the circuit, the fuse means F being comprised of a polycrystalline silicon layer that is formed on the semiconductor substrate via an insulating film. Further, a pull-down resistor R having a relatively high resistance is provided between the gate of MOSFET Q14 and a point of ground potential of the circuit. When the fuse means F is not melted down, therefore, the MOSFET Q14 remains conductive; when the fuse means F melts, the MOSFET Q14 is rendered nonconductive.

The inverter circuit IV1, of which the input terminal is connected to the capacitor C, is allowed to have a suitable logic threshold voltage. The high level or the low level of input is discriminated depending upon the logic threshold voltage. That is, the inverter circuit IV1 substantially constitutes a level discrimination circuit. When noise that is imparted to the capacitor C due to undesired coupling occurs, the inverter circuit IV1 may be replaced by a hysteresis circuit, such as a Schmidt circuit, having two threshold voltages.

Figure 3:
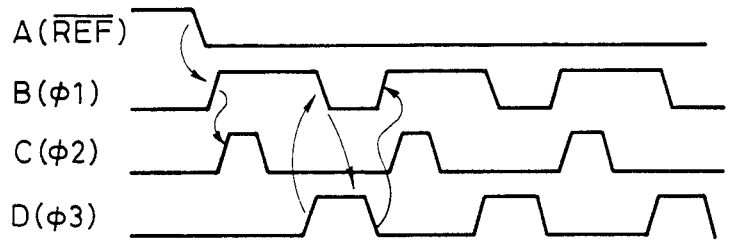
FIG. 3 is a timing diagram illustrating the operation of the circuit of the embodiment of the present invention shown in FIG. 2.

As will be described later in detail with reference to a timing chart of FIG. 3, the output $\phi 3$ of the inverter circuit IV1 assumes the high level lagging the signal $\phi 1$, which has assumed the high level by a predetermined period of time.

When the NOR gate circuit G1 is open, the output $\phi 1$ of the inverter circuit IV1 is fed back therethrough to the input of the inverter circuit IV3. Under this condition, the output of the inverter circuit IV3 and the output of the NOR gate circuit G1 assume the high level and the low level maintaining a predetermined period of time. Therefore, being combined with the NOR gate circuit, the timer circuit TM substantially constitutes a control timer or a control oscillation circuit.

As will be described later, the timer circuit TM monitors the level of the refresh control signal $\overline{REF}$ to discriminate the operation mode of the automatic refresh operation or the self-refresh operation, and to determine the self-refresh cycle.

In FIG. 2, a symbol CONT denotes a refresh address counter which, upon receipt of a pulse $\phi 2$ as an incrementing pulse, forms internal complementary address signals ar0 to ari for the refresh operation. That is, the refresh control signal $\overline{REF}$ supplied through the external terminal is supplied to one input of the NOR gate circuit G1 which is served with an output signal $\phi 3$ of the timer circuit TM through the other input terminal thereof. The output signal $\phi 1$ of the NOR gate circuit G1 is supplied as a control signal for the timer circuit TM and is delayed and inverted through the delay circuit DL and the inverter circuit IV2. The signal which is inverted and delayed, and the output signal $\phi 1$ are input to the AND gate circuit G2. The delay circuit DL, inverter circuit IV2 and AND gate circuit G2 substantially constitute a pulse width converter circuit which receives the signal $\phi 1$ as an input signal. That is, in synchronism with the rise of the signal $\phi 1$, the AND gate circuit G2 forms a pulse $\phi 2$ having a width which is set by the delay circuit DL. The pulse $\phi 2$ is input to the refresh address counter CONT to step up the refresh address operation.

The operation of the refresh control circuit REFC will be explained below in conjunction with the timing diagram of FIG. 3.

When the refresh control signal $\overline{REF}$ supplied through the external terminal assumes the high level (logic "1" as shown in FIG. 3A, that is, when instruction is issued for a refresh operation, the output signal $\phi 1$ of the NOR gate circuit G1 is maintained at a correspondingly low level (FIG. 3B). At this moment, the input signal $\overline{\phi 1}$ to the timer circuit is maintained at the level inverted by the inverter circuit IV3, i.e., maintained at the high level, so that the precharge MOSFET Q11 is rendered conductive. Therefore, the capacitor C is precharged, and the inverter circuit IV1 produces an output signal (timer output signal) $\phi 3$ of the low level as shown in FIG. 3D.

Next, as the refresh control signal $\overline{REF}$ supplied through the external terminal assumes the low level (logic "0") as shown in FIG. 3A, that is, when the instruction is issued for refresh operation, the NOR gate circuit G1 produces the output signal $\phi 1$ of a correspondingly high level. Therefore, the input pulse $\phi 2$ to the refresh address counter CONT is formed as shown in FIG. 3C. As the output signal $\phi 1$ assumes the high level, the input signal $\overline{\phi 1}$ to the timer circuit TM assumes the low level, whereby the precharge MOSFET Q11 is rendered nonconductive, and the discharge MOSFET's Q12, Q13 are rendered conductive. As the MOSFET's Q12, Q13 are rendered conductive, the capacitor C starts to discharge.

When the refresh control signal $\overline{REF}$ supplied through the external terminal is maintained at the low level, the charge on the capacitor C is reduced due to discharge. When the charge is lower than the logic threshold voltage of the inverter circuit IV1, the output signal $\phi 3$ of the high level is produced by the inverter circuit IV1. Therefore, the output signal $\phi 1$ of the NOR gate circuit G1 assumes the low level again as shown in FIG. 3B, and the timer circuit TM is precharged by the output signal $\phi 1$. Accordingly, the output signal $\phi 3$ assumes the low level again as shown in FIG. 3D. In response to the output signal $\phi 3$ at the low level, the NOR gate circuit G1 produces an output signal $\phi 1$ at the high level, whereby the pulse $\phi 2$ is formed as mentioned above, and the timer circuit TM is energized. The above-mentioned operation is continued as far as the refresh control signal $\overline{REF}$ assumes the low level.

Operation of the refresh address counter CONT is stepped up by the pulse signal $\phi 2$. Further, as the signal $\phi 1$ assumes the high level, the multiplexer MPX of FIG. 1 is switched to the side of the refresh address counter CONT. The word line is selected by the address signals ar0 to ari that are changed as the refresh address counter CONT is stepped up, and whereby the refresh operation is carried out. That is, responsive to the signal $\phi 1$ at the high level, the refresh address signals ar0 to ari are supplied to the row decoder R-DCR via the multiplexer MPX. Further, a variety of timing signals of the row system are generated in response to the signal $\phi 1$. Therefore, the refresh operation is executed.

If the period in which the refresh control signal $\overline{REF}$ assumes the low level is set to be shorter than the preset time of the timer circuit TM, the pulse signal $\phi 2$ is formed in synchronism with the refresh control signal $\overline{REF}$ of the low level. In this case, therefore, the refresh operation is performed automatically according to the period of the refresh control signal $\overline{REF}$.

In the timer circuit TM of this embodiment, the discharge MOSFET Q14, which will be rendered nonconductive when the fuse means F melts, is provided in parallel with the discharge MOSFET Q13. When the fuse means F melts, the discharge current of the capacitor C decreases correspondingly; hence, the timer period is lengthened. When the fuse means F does not melt, the MOSFET Q14 remains conductive, and the conductance between the drain and the source thereof is relatively low. The discharge current of the capacitor C becomes large. In this case, therefore, the timer period is shortened.

The fuse means F is programmed as described below, but it is not limited to this configuration.

That is, refresh characteristics of the dynamic RAM formed on the semiconductor wafer are inspected and measured. When the refresh characteristics of the dynamic RAM are found to be favorable, the refresh period may be lengthened. In this case, therefore, the fuse means F melts in the inspection step. The fuse means F melts as described below, but it is not limited to this method. That is, in the step of inspection, a needle probe composed of, for example, tungsten is brought into electric contact with each of the electrodes of the dynamic RAM. At this moment, the needle probe is also brought into contact with two terminals of the fuse means F. Based upon the result of inspection and measurement, the melting voltage is applied to the fuse means F via the needle probe. The fuse means F therefore melts.

Figure 4:
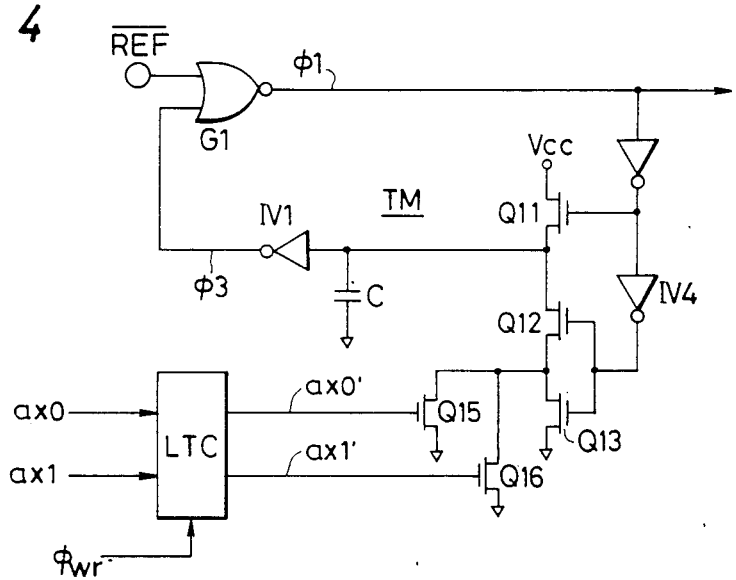
FIG. 4 is a diagram of a circuit according to another embodiment of the present invention.

FIG. 4 is a diagram of a timer circuit TM according to another embodiment.

According to this embodiment, the discharge MOSFET Q14, fuse means F, and resistor R of FIG. 2, are replaced by discharge MOSFET's Q15, Q16, and a latch circuit or a register LTC.

The sizes of the MOSFET's Q15 and Q16 are so determined as to have conductances at a ratio of 1 to 2 when they are rendered conductive, but they are not limited to this configuration.

The latch circuit LTC receives address signals ax0 and ax1 of two bits among the internal complementary address signals ax0 to axi of the row system sent from the address buffer ADB of FIG. 1, and is controlled for its latching operation by the timing signal $\phi wr$. Though not concretely diagrammed, the latch circuit LTC is constituted by a signal holder circuit consisting of static flip-flops of two bits that correspond to the address signals ax0 and ax1.

The timing control circuit TC of FIG. 1 is constituted to generate a timing signal $\phi wr$ in synchronism with the operation of the address buffer ADB when instruction for the operation mode for controlling the timer is issued to the dynamic RAM. Though not particularly limited to this method, instruction for the operation mode for timer control is issued by the $\overline{RAS}$ signal and the $\overline{WE}$ signal of the low level when the $\overline{CAS}$ signal is maintained at the high level. Namely, instruction for the operation mode for timer control is issued by a combination of $\overline{RAS}$ signal, $\overline{CAS}$ signal and $\overline{WE}$ signal, among a variety of combinations thereof, but that is not ordinarily required when accessing the RAM. When the instruction for the timer control mode is to be issued by the combination of $\overline{RAS}$ signal, $\overline{CAS}$ signal and $\overline{WE}$ signal as mentioned above, there is no need to increase the number of external terminals of the dynamic RAM.

Therefore, when the instruction for the timer control mode is issued by the above-mentioned three control signals, the latch circuit LTC latches address signals ax0 and ax1 corresponding to address signals of two bits among the external address signals ax0 to axi. The data to the latch circuit LTC is preset, for example, by the initialize program that is executed when the power source is closed for a microcomputer system that utilizes the dynamic RAM of this embodiment.

The address signals held by the latch circuit LTC are regarded to be those for timer control. Though not particularly limited to this method, these signals are directly supplied to the MOSFET's Q15 and Q16.

According to this embodiment, the two MOSFET's connected in parallel exhibit four conductances depending upon the output of the latch circuit LTC. Therefore, the timer TM exhibits four different periods. A first period of the timer TM corresponds to the case where both the MOSFET Q15 and the MOSFET Q16 are rendered conductive; the second period corresponds to the case where only the MOSFET Q16 having a relatively large conductance is rendered conductive; the third period corresponds to the case where only the MOSFET Q15 having a relatively small conductance is rendered conductive; the fourth period corresponds to the case where both the MOSFET Q15 and the MOSFET Q16 are rendered non-conductive.

According to the present invention, the effects can be obtained as described below.

(1) The timer period can be varied by simply providing discharge MOSFET's that are selectively operated by program elements.

(2) By realizing the automatic refresh operation using the variable timer circuit, the refresh cycle can be set depending upon the refresh characteristics of the memory array. This makes it possible to reduce the current caused by the wasteful refresh operation, thereby reducing the consumption of electric power.

(3) Owing to the reasons mentioned in (2) above, the consumption of electric power can be reduced during the self-refresh operation. Therefore, the life of the battery that backs up the device can be extended.

The invention accomplished by the inventors was concretely described in the foregoing. However, the invention is in no way limited to the above-mentioned embodiments but can be modified in a variety of other ways without departing from the spirit and scope of the invention. For instance, the program element for varying the timer period may be constituted by a substantially nonvolatile memory element such as MOS diode or pn junction diode that can be selectively destroyed. The program element is connected to a predetermined external terminal and is so programed as to set a timer period after the semiconductor integrated circuit device has been finally completed. The automatic refresh circuit can be constituted in a variety of forms. For instance, an oscillator is contained, and the address is incremented by the oscillator pulse every after the timer period, in order to continuously perform a series of refresh operations.

The present invention can be widely adapted to semiconductor integrated circuit devices such as dynamic RAM's containing an automatic refresh circuit which employs the aforementioned timer circuit, as well as to semiconductor integrated circuit devices containing a timer circuit which determines whether a given signal is maintained at a predetermined level for a predetermined period of time.

What is claimed is:

1. A semiconductor integrated circuit device which includes memory cells that need to be periodically refreshed, and which includes means for performing an inspection step which examines refresh characteristics and means for generating a signal for use in determining a refresh period, said semiconductor integrated circuit device comprising:
   a timer circuit which generates output signals for determining a refresh timing of said memory cells and which comprises a program circuit which changes the period of said output signals according to said signal.

2. A semiconductor integrated circuit device according to claim 1, wherein said timer circuit has a gate circuit to control the generation of said output signals.

3. A semiconductor integrated circuit device according to claim 2, wherein said program circuit comprises a nonvolatile memory element that can be programmed.

4. A semiconductor integrated circuit device according to claim 3, wherein said program circuit comprises a fuse element and a resistance element connected in series therewith.

5. A semiconductor integrated circuit device according to claim 2, further comprising an address counter which forms address signals corresponding to said memory cells.

6. A semiconductor integrated circuit device according to claim 5, wherein said address counter receives the signals produced from said timer as incrementing pulses.

7. A semiconductor integrated circuit device according to claim 6, wherein said program circuit comprises a nonvolatile memory element that can be programmed.

8. A semiconductor integrated circuit device according to claim 7, wherein said program circuit comprises a fuse element and a resistance element connected in series therewith.

9. A semiconductor integrated circuit device comprising:
- a first switching element which permits the flow of charging current to a capacitor;
- a second switching element which forms a discharge path for said capacitor;
- means coupled to said first and second switching elements for driving said first and second switching elements so that said first and second switching elements are rendered conductive at timings different from each other;
- a first variable impedance element connected in series with said second switching element;
- a program element coupled to said first variable impedance element for determining the impedance of said first variable impedance element; and
- a level detector circuit which detects the level of voltage of said capacitor.

10. A semiconductor integrated circuit device according to claim 9, wherein said means comprises a feedback circuit which controls the operation of each of said first and second switching elements based upon the output of said level detector circuit.

11. A semiconductor integrated circuit device according to claim 10, wherein each of said first and second switching elements, and said first variable impedance element comprises an MOSFET.

12. A semiconductor integrated circuit device according to claim 11, wherein said first variable impedance element is connected in parallel with a second variable impedance element of which the switching function is controlled in synchronism with said second switching element.

13. A semiconductor integrated circuit device comprising:
- a plurality of dynamic memory cells that must be periodically refreshed;
- a decoder circuit for selecting said memory cells;
- an address buffer; and
- a refresh control circuit which comprises:
  - a program circuit which comprises a program element and which generates an output signal according to the condition of said program element;
  - a timer circuit coupled to said program circuit for producing output signals whose pulse period varies depending upon said output signal of said program circuit;
- an address counter which counts the output signals of said timer circuit to form an address signal; and
- means for forming a control signal which controls a multiplexer;
- wherein said multiplexer is coupled to said refresh circuit for supplying to said decoder circuit the address signal produced either by said address buffer or by said address counter in accordance with said control signal, so that said multiplexer supplies to said decoder circuit the address signal produced by said address counter when the dynamic memory cells specified by said address counter are refreshed.

* * * * *